(12) United States Patent
Cheng et al.

(10) Patent No.: US 7,532,446 B2
(45) Date of Patent: May 12, 2009

(54) PROTECTION CIRCUIT FOR ELECTRO STATIC DISCHARGE

(75) Inventors: Tao Cheng, Hsin-Chu (TW);
Hsueh-Kun Liao, Hsin-Chu Hsien (TW)

(73) Assignee: Mediatek Inc., Hsin-Chu (TW)

( * ) Notice: Subject to any disclaimer, the term of this patent is extended or adjusted under 35 U.S.C. 154(b) by 154 days.

(21) Appl. No.: 10/838,272

(22) Filed: May 5, 2004

(65) Prior Publication Data

US 2005/0013073 A1 Jan. 20, 2005

(30) Foreign Application Priority Data

Jul. 16, 2003 (TW) .............................. 92119457 A (51) Int. Cl.
*H02H 9/00* (2006.01)
(52) U.S. Cl. .......................... 361/56; 361/91.1; 361/111
(58) Field of Classification Search .................... 361/56, 361/91.1, 111
See application file for complete search history.

(56) References Cited

U.S. PATENT DOCUMENTS 5,440,162 A * 8/1995 Worley et al. ............... 257/355

6,259,140 B1 * 7/2001 Liu et al. ..................... 257/360
6,559,503 B2 * 5/2003 Wendel et al. ............... 257/333
6,667,870 B1 * 12/2003 Segervall ..................... 361/111
2002/0130390 A1 9/2002 Ker et al.

\* cited by examiner

*Primary Examiner*—Stephen W Jackson
*Assistant Examiner*—Terrence R Willoughby
(74) *Attorney, Agent, or Firm*—Winston Hsu (57) ABSTRACT

An electro static discharge (ESD) protection circuit employing a field-effect transistor (FET) having no silicide block disposed thereon. It is connected with an internal circuit so as to prevent the internal circuit from the influence of an ESD event, wherein the internal circuit has at least a signal input end. The ESD protection circuit includes: an ESD clamp circuit for providing an ESD grounding path as an ESD occurs; and at least a pair of p-n junction diodes. The p-n junction diodes are stacked so that one of the p-n junction diodes has a n-type end coupled to the signal input end and the other one has a p-type end coupled to the signal input end as well. The ESD clamp circuit has at least a FET, whose drain has no silicide block disposed thereon.

12 Claims, 6 Drawing Sheets

PROTECTION CIRCUIT FOR ELECTRO STATIC DISCHARGE

This Nonprovisional application claims priority under 35 U.S.C. § 119(a) on patent application No(s). 092119457 filed in TAIWAN on Jul. 16, 2003, the entire contents of which are hereby incorporated by reference.

FIELD OF THE INVENTION

The present invention is directed to a protection circuit for electro static discharge (ESD), and more particularly, to a protection circuit employing a metal-oxide semiconductor field-effect transistor (MOSFET) having no silicide block disposed on its drain.

BACKGROUND OF THE INVENTION

In accordance with the prior art, it is well known that ESD is a main factor to cause electronic devices or systems to be damaged by electrical overstress (EOS). ESD may make semiconductor devices and computer systems be damaged permanently, hence it can influence functions of integrated circuits (IC) and make the electronic devices operate abnormally. In most situations, ESD is induced artificially, but it is still hard to avoid this effect. The reason is that the static electricity would accumulate in human bodies, instruments and store equipments during the processes of manufacturing, producing, assembling, storing or moving of the electronic devices and systems. Even the electronic devices would accumulate static electricity itself. In some circumstances, due to contacting the electronic devices with human bodies, instruments and store equipments unknowingly, it may form a path of ESD and make the electronic devices or systems be damaged unexpectedly.

In order to prevent the electronic devices from being damaged by the ESD current effectively, the ESD protection circuits used to drain the ESD current away become necessary. Up to now, a lot of technology about used components or manufacturing improvement of the components in the ESD protection circuits has been accumulated for successor' reference. In general, the components of the ESD protection circuits may include reverse-biased diode, bipolar transistor, MOS component and silicon-controlled rectifier (SCR), etc. In these ESD protection circuits, most of them use the components that can operate at first breakdown region to drain out the ESD current. In the first breakdown region, the component of the ESD protection circuits wouldn't be damaged. However, there is still a limit. It is so-called secondary breakdown region. When the components operate at the second breakdown region due to the additional EOS current or voltage, they will be damaged permanently. Further, these components can also be turned on, such as turning on a FET component to form a current grounding path between its source and drain, to make the ESD current be passed to the ground via the current grounding path.

In general, the ESD protection circuits are designed according to the human body model (HBM) and machine model (MM). However, as the deep sub-micron techniques became the main stream of the market, the ESD of the charge device model (CDM) can cause the damage of gate oxide very easily when the thickness of the gate oxide is only 50A made by 0.25 micro manufacturing processes.

The so-called HBM or MM indicates that the static electricity of external human bodies or machines is passed to internal circuits via pins of IC. Hence, the ESD protection circuits are usually disposed beside the input or output boding pad of the internal circuits directly to drain off the ESD current. On the other hand, the static charges are stored in the substrate of electronic components, when a pin is grounded, these charges will be discharged via the grounded pin. The ESD of CDM can make the gate of input end be punched through very easily. Even if the ESD protection circuit is already applied to the gate of the input end, in most situations, it still cannot be turned on timely to drain off the immediately generated ESD current of CDM.

Figure 1:
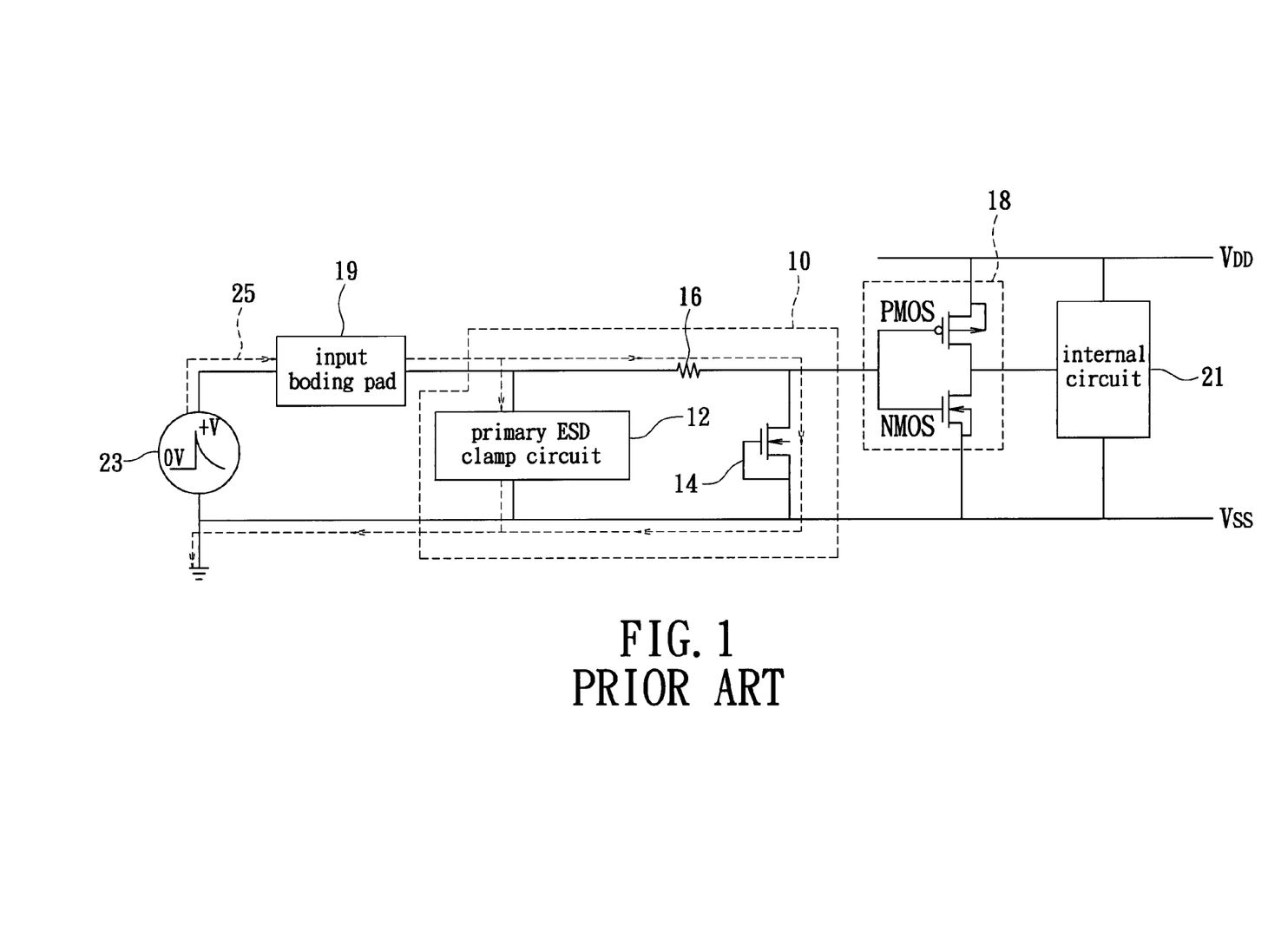
FIG. 1 is a schematic diagram of a conventional ESD protection circuit.

Please refer to FIG. 1, which is a schematic diagram of a conventional ESD protection circuit. The ESD protection circuit 10 includes a primary ESD clamp circuit 12, secondary ESD clamp circuit 14 and resistor 16. The resistor 16 first connects with the secondary ESD clamp circuit 14 in series and then connects with the primary ESD clamp circuit 12 in parallel. The ESD protection circuit 10 is disposed beside the input boding pad 19 to prevent the internal circuit 21 from the influence due to the ESD current 25 induced by the external ESD voltage 23 damages the complementary MOS transistors 18.

When ESD of HBM or MM is induced at the input boding pad 19, the external ESD voltage 23 would bias the gates of the complementary MOS transistors 18. Hence, the main function of the secondary ESD clamp circuit 14 is to resist the exceeding ESD voltage 23 so as to prevent the complementary MOS transistors 18 from being damaged by the ESD voltage 23. In general, the secondary ESD clamp circuit 14 is carried out by employing a short-channel NMOS component, which can't bear high ESD voltage 23. Hence, the resistor 16 and the primary ESD clamp circuit 12 should be added to prevent the exceeding ESD current 25 from passing the secondary ESD clamp circuit 14 composed of the NMOS component. The ESD current 25 is mainly drained off by the primary ESD clamp circuit 12, hence the primary ESD clamp circuit 12 should be composed of the components that can bear large current. These components have high turn-on voltage and slow turn-on speed generally, hence the primary ESD clamp circuit 12 should cooperate with the secondary ESD clamp circuit 14 for effectively protecting the gates of the complementary MOS transistors 18. However, the ESD protection circuit 10 is equivalent to a combination of large resistors and capacitors. It has large RC delay time for the input signal and is not suitable for applications with high-frequency signals or current input signals.

Figure 2:
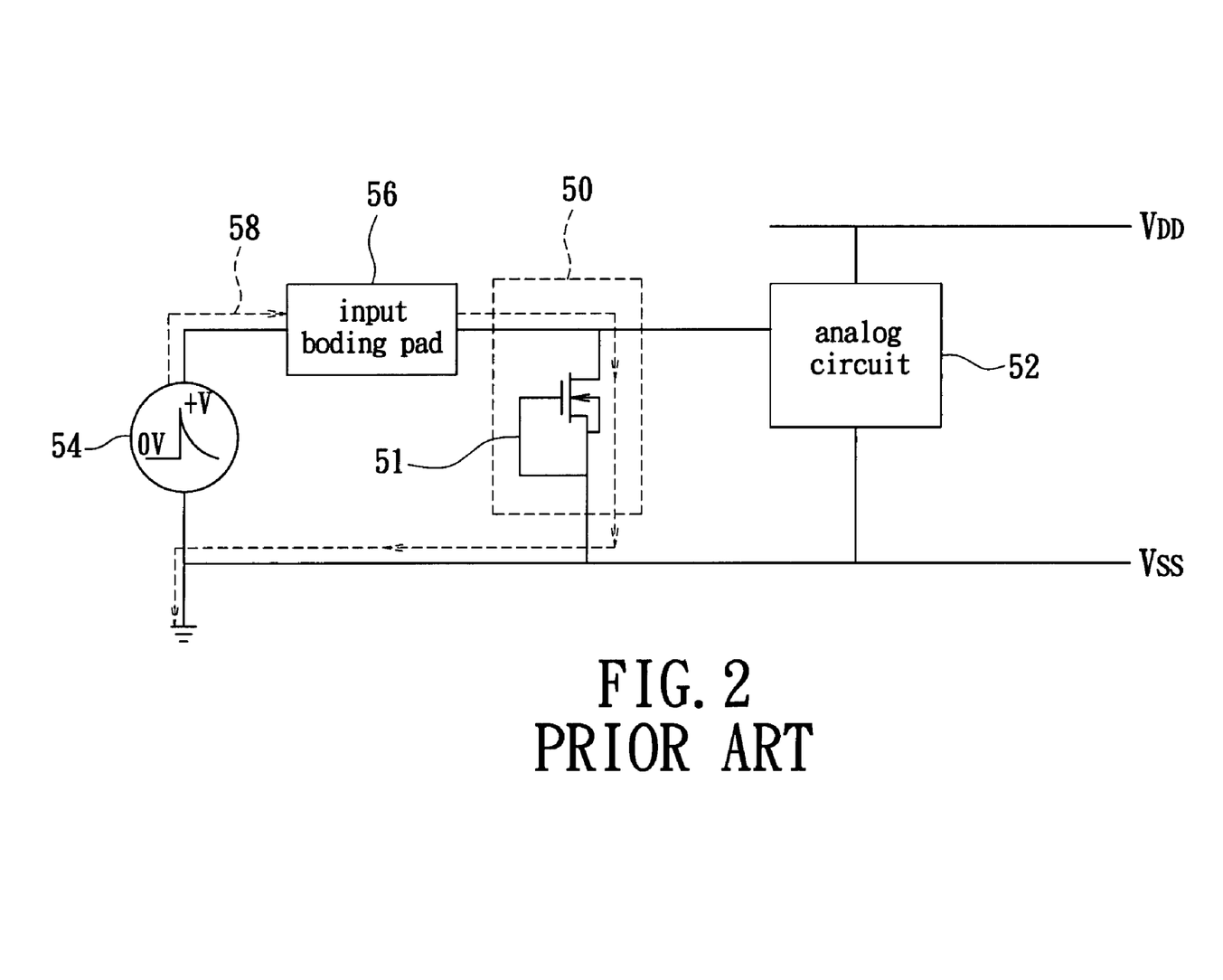
FIG. 2 is a schematic diagram of another conventional ESD protection circuit.

Please refer to FIG. 2, which is a schematic diagram of another conventional ESD protection circuit. In order to improve the shortcoming of the ESD protection circuit 10 in the applications with high-frequency signals or current input signals, the ESD protection circuit 50 only employs the NMOS transistor 51 for resisting the ESD effect without additional ESD clamp circuit and shout resistor. Hence, the equivalent input resistor of the input end is decreased so that the ESD protection circuit 50 is more suitable than the ESD protection circuit 10 shown in FIG. 1 for the applications with high-frequency signals or current input signals. However, the ESD protection circuit 50 is composed of the NMOS transistor 51, whose gate is grounded, without the shout resistor 16 shown in FIG. 1. Its robustness is avoidably challenged by the ESD current passed through the NMOS transistor 51. When the ESD voltage 54 is induced, the ESD current 58 is first passed to the ESD protection circuit 50 via the input boding pad 56 so that the analog circuit 52 will not be damaged directly.

However, as the advanced manufacturing processes, such as light doped drain (LDD) and silicided diffusion processes, are employed, the compact degree of integrated circuits (IC) and the calculation speed are increased, but the ESD resisting ability of the IC (including the internal circuits and ESD protection circuits) is decreased.

In order to overcome the problem regarding the decreasing of the ESD resisting ability of the LDD structure, the ESD-implant process is developed. Its method is to make two different kinds of NMOS components in a complementary MOS (CMOS) manufacturing process; one is of the LDD structure used for the internal circuit with the and the other isn't of the LDD structure used for the input/output stage. In order to make these two kinds of components together in the manufacturing process at a time, an additional ESD-implant mask and some additional processing steps are necessary in the original process. Furthermore, due to the NMOS components made by the ESD-implant process is different from the NMOS components with the LDD structure, it needs some additional processes and design to obtain their SPICE parameters to facilitate the simulation and design of circuits.

As per the silicided diffusion process, its main objective is to reduce the stray resistances of the drain and source of the MOS component to increase the operation speed of the MOS component for high-frequency applications. Since the stray resistances are very small, as the ESD occurs, the ESD current is easily passed to the LDD structure of the MOS components to damage them. Even if the MOS component with large width/length (W/L) ratio is used as output stage, the ESD resisting ability still can't be improved. In order to increase the ESD resisting ability of the output stage the silicided diffusion blocking process is developed. It removes part of the silicide layer of the output-stage MOS component to make the source and drain resistances of the MOS increased to improve the ESD resisting ability of the MOS component.

Figure 3A:
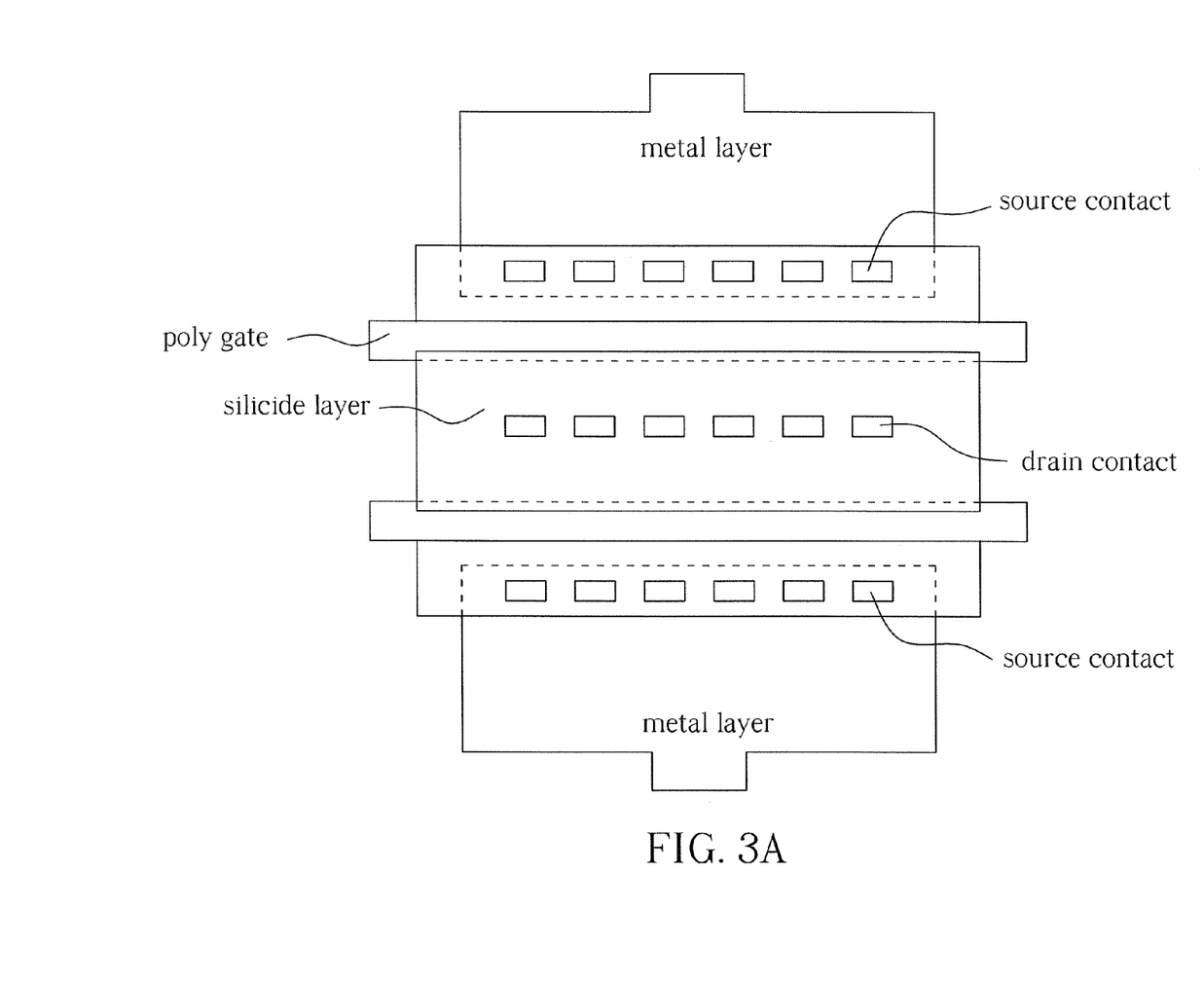
FIG. 3a is a schematic diagram of a MOS component without a silicide block according to the prior art.
Figure 3B:
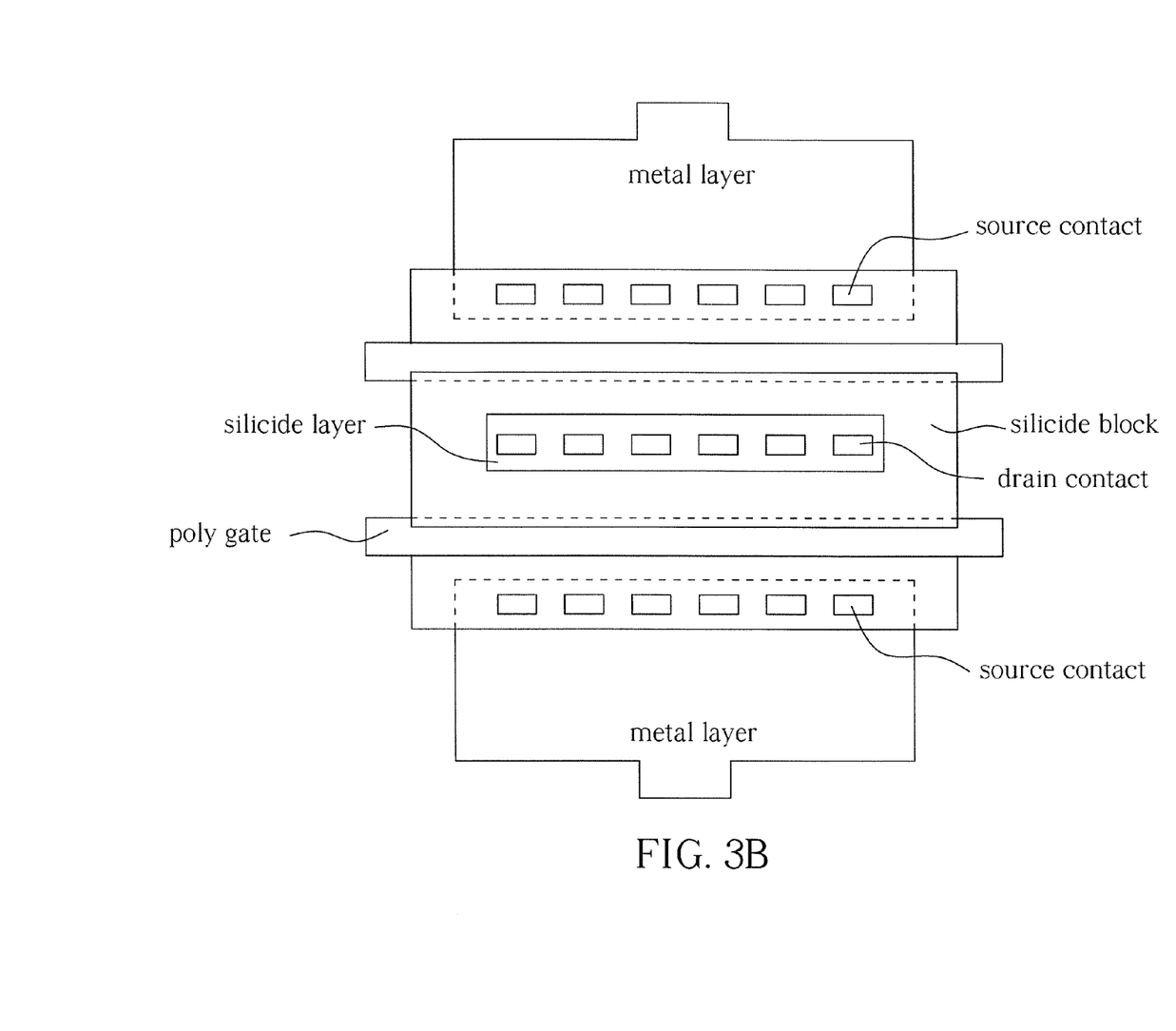
FIG. 3b is a schematic diagram of a MOS component with a silicide block according to the prior art.

Please refer to FIGS. 3a and 3b, which are schematic diagrams of MOS components without and with a silicide block, respectively, according to the prior art. In order to dispose the silicide block, the spacing between the drain and source should be large enough. Although the silicide block is used to increase the resistance between the drain and the poly gate to restrict the electric current and hence improve the ESD resisting ability of this kind of MOS component, it increases the occupying area of the MOS due to the increase of the spacing between the source and drain. Hence, the number of the MOS components able to be made in a single wafer would be influenced. Further, in the viewpoint of input end, the increase of resistance would increase the RC delay time of the input signal. Hence, this kind of components is not suitable for the inputs with high-frequency signal or current signals.

Figure 4:
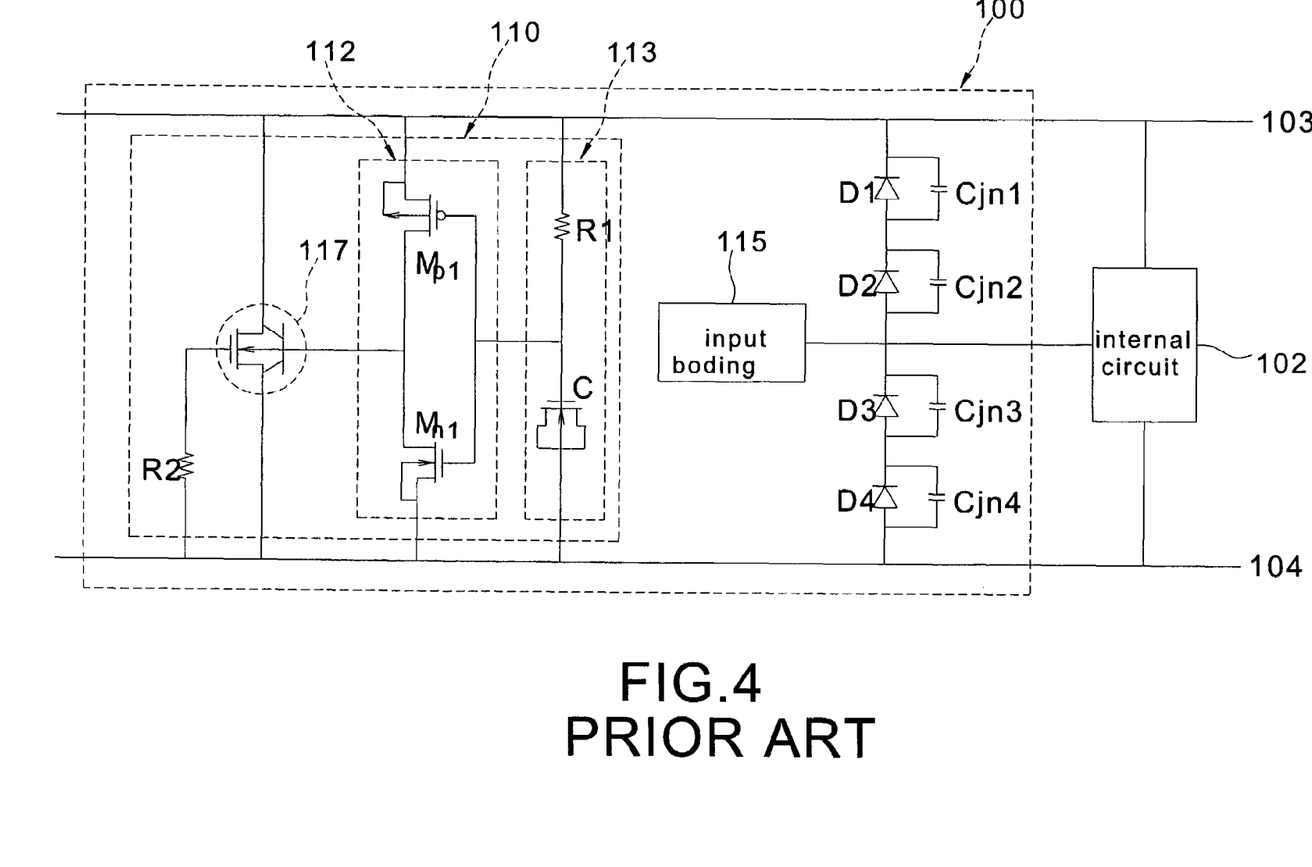
FIG. 4 is a schematic diagram of an ESD protection circuit disclosed in U.S. 2002/0130390.

Please refer to FIG. 4, which is a schematic diagram of an ESD protection circuit disclosed in U.S. 2002/0130390. Both of the ESD protection circuit 100 and the internal circuit 102 are at least connected with two power lines 103 and 104. Therein, the power lines 103 and 104 are preferable to be a power supply line and ground line, respectively.

The ESD protection circuit 100 includes an ESD restricting circuit 110 disposed between the power lines 103 and 104, which is composed of a CMOS inverter 112 and a RC retarder 113. It can make the ESD current induced by the ESD voltage obtain an ESD path formed by a forward-biased diode pair (D1, 2 or D3, 4) or a substrate-triggered MOS transistor 117 of the ESD restricting circuit 110 disposed between the power lines that is operated at the first breakdown region (or snap-back breakdown region). The CMOS inverter 112 is used to trigger the substrate-triggered MOS transistor 117. The gate of the substrate-triggered MOS transistor 117 is connected with the power line 104 via a resistor R2 so that the substrate-triggered MOS transistor 117 is turned off in the situation without ESD. The ESD protection circuit 100 is directly disposed between the input bonding pad 115 and the internal circuit 102 for providing the ESD path. The diodes D1~4 are equivalent to capacitances Cjn1~4. They are connected in series so that the total equivalent capacitance is decreased as the number of the diodes increases.

In the ESD protection circuit 100 shown in FIG. 4, all of the MOS components in the substrate-triggered MOS transistor 117, CMOS inverter 112 and RC retarder 113 (the capacitor C is carried out by employing a MOS component) has the silicide blocks disposed in their drains as mentioned above. With the silicide blocks, the ESD resisting ability can be improved certainly, but the increased equivalent input resistance would restrict the application of this kind of component in high-frequency field. Further, the occupying area of this kind of MOS components is larger that of the MOS components with silicide block. Hence, the number of the MOS components able to be made in a single wafer would be decreased.

Accordingly, as discussed above, the conventional ESD protection circuit still has some drawbacks that could be improved. The present invention aims to resolve the drawbacks in the prior art.

SUMMARY OF THE INVENTION

A main objective of the present invention is to provide an ESD protection circuit, which employs a FET component having no silicide block. As ESD occurs, an ESD clamp circuit of the ESD protection circuit turns on the FET component to provide an ESD grounding path for draining off the ESD current so as to prevent the internal circuit from damage. The portion of the present invention different from the prior art is that the ESD protection circuit complied with the present invention employs a FET component having no silicide block so that the equivalent resistance between the drain and source can be reduced. Hence, the ESD protection circuit of the present has an equivalent input resistance and capacitance that is suitable for high-frequency input signals or current input signals. Meanwhile, it also can reduce the occupied area of a single FET component. Besides, its ESD resisting ability for HBM or MM is the same as that of the prior art.

For reaching the objective above, the present invention provides an ESD protection circuit, including an ESD clamp circuit for providing an ESD grounding path as an ESD occurs, and at least a pair of p-n junction diodes. One of the p-n junction diodes has a n-type end coupled to the signal input end and the other one has a p-type end coupled to the signal input end. The ESD clamp circuit has at least a FET, whose drain has no silicide block disposed thereon. As the ESD occurs, the FET of the ESD clamp circuit used to provide the ESD grounding path is operated at turn-on status.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

Figure 5:
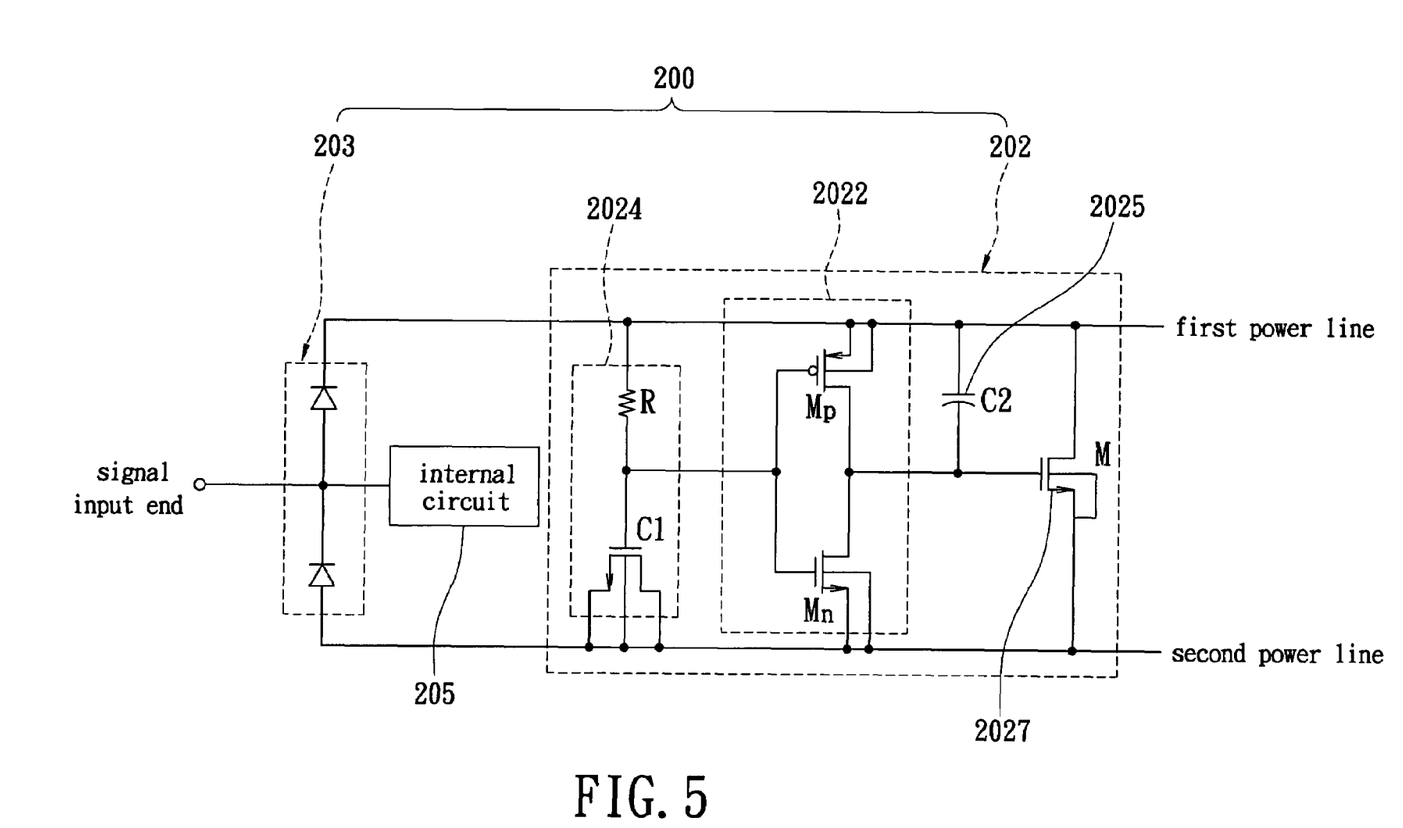
FIG. 5 shows a schematic diagram of an ESD protection circuit complied with the present invention.

Please refer to FIG. 5, which shows a schematic diagram of an ESD protection circuit complied with the present invention. The ESD protection circuit has an ESD clamp circuit and at least a pair of p-n junction diodes 203 to prevent the internal circuit 205 from damaged by the ESD (mainly in HBM or MM) induced at the signal input end.

The ESD clamp circuit 202 includes a CMOS inverter (Mp and Mn) 2022, a RC retarder 2024 (the capacitor C1 is carried out by using a MOS component), a coupling capacitor 2025 (C2) and a FET 2027 (M). Therein, the coupling capacitor C2 is coupled to the FET M. Meanwhile, the drain of the FET M has no silicide block disposed thereon (as shown in FIG. 3a). In the conventional ESD protection circuit, in order to increase the resistance between the drain and source of a FET to restrict the ESD current, the FET must have the silicide block (as shown in FIG. 3b). The ESD protection circuit complied with the present invention has no silicide block and it still can bear 7 kV and 450 kV ESD voltages in HBM and MM, respectively.

As the ESD occurs, the CMOS inverter 2022 turns on the FET M to provide a grounding path formed between the drain and source of the FET M for the ESD current. Besides, the coupling capacitor C2 is used to increase the turn-on effect of the FET M. The reason is that the coupling capacitor C2 can couple the ESD voltage appeared on the first power line to the gate of the FET M. The first and second power lines are coupled to the drain and source of the FET M, respectively. Therein, one of the first and second power lines is preferred to be a grounding line. The ESD clamp circuit 202 is located between the first and second power lines for providing an ESD path. One of the p-n junction diodes 203 has a n-type end coupled to the signal input end the other one has a p-type end coupled to the signal input end. Each of the p-n junctions of the diodes 203 is equivalent to a junction capacitor. These two capacitors are connected in series so that the total capacitance is reduced. As the number of the p-n junction diode pairs is increased, the equivalent input capacitance is reduced deservedly. In the present invention, the number of the p-n junction diode pairs is not limited.

As the ESD protection circuit 200 is tested complied with the HBM or MM, since the accumulated static electricity at the signal input end can be positive or negative charges, the testing input signal can be positive or negative pulse selectively. Further, one of the first and second power lines also can be grounded selectively. Hence, there are four modes for testing, named PS, NS, PD and HD respectively. Of course, there are various ESD tests between the signal pins (not necessary to be the signal input end) or between the first and second power lines. If there are differential pairs existed in the internal circuit, there are more tests able to be performed. These tests can verify that the ESD protection circuit can form a corresponding ESD grounding path for draining the ESD current to the ground as the real ESD occurs.

As no ESD occurs, the p-n junction diodes are reverse biased, but not under breakdown status. Hence, the signals from the input signal end can be passed to the internal circuit. As ESD occurs, the p-n junction diodes are forward biased. The RC retarder 2024 is used to control the CMOS inverter 2022 to make it bias the FET M.

The FET M has no silicide block as shown in FIG. 3a. In general, the FET applied for an ESD protection circuit is used to drain the ESD current (it can operate under drain-source turn-on status or reverse breakdown status), hence employing silicide block to increase resistance so as to reduce the current passed through the FET to prevent the FET from damage is a very important technique in the prior art. However, as mentioned above, due to the restriction in size, the number of the components able to be made in a single wafer would be decreased, as the silicide block is disposed in the FET to increase the occupied area of the FET.

Comparing with the prior art, the FET for providing an ESD grounding path in the ESD protection circuit of the present invention has no silicide block disposed thereon. Besides, it is operated by turning on itself to form the ESD grounding path between its drain and source. Without the silicide block, the occupied area of the FET is reduced and the number of the components able to be made in a single wafer would be increased.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. An electro static discharge (ESD) protection circuit, comprising:
    a first power line;
    a second power line;
    a pair of p-n junction diodes coupled between the first power line and the second power line, wherein the pair of p-n junction diodes has a signal input end arranged to receive an input signal; and
    an ESD clamp circuit coupled between the first power line and the second power line, the ESD clamp circuit comprising:
        a transistor having a drain electrically connected to the first power line, a source and a substrate electrically connected to the second power line, and a gate, wherein the drain of the transistor has no silicide block disposed thereon, the drain of the transistor has a silicide layer disposed thereon, and the silicide layer remains intact after disposed on the drain of the transistor; and
        a coupling capacitor coupled between the first power line and the gate of the transistor.

2. The ESD protection circuit as claimed in claim 1, wherein the ESD clamp circuit further comprises:
    a CMOS inverter coupled between the first power line and the second power line, wherein the CMOS inverter is arranged to control the gate of the transistor; and
    an RC retarder coupled between the first power line and the second power line, wherein when an ESD occurs, the RC retarder is arranged to control the CMOS inverter to turn the transistor on.

3. The ESD protection circuit as claimed in claim 1, wherein the transistor is a gate-coupled field-effect transistor.

4. The protection circuit as claimed in claim 1, wherein the second power line is grounded.

5. The protection circuit as claimed in claim 1, wherein the ESD clamp circuit is arranged to provide a grounding path from the first power line to the second power line through the transistor.

6. The protection circuit as claimed in claim 1, wherein when the ESD occurs, a corresponding ESD voltage is induced to bias the gate of the transistor via the coupling capacitor.

7. An electro static discharge (ESD) protection circuit, comprising:
   a first power line;
   a second power line;
   a pair of p-n junction diodes coupled between the first power line and the second power line, wherein the pair of p-n junction diodes has a signal input end arranged to receive an input signal; and
   an ESD clamp circuit coupled between the first power line and the second power line, the ESD clamp circuit comprising:
       a transistor having a drain electrically connected to the first power line, a source and a substrate electrically connected to the second power line, and a gate, wherein the drain of the transistor has no silicide block disposed thereon, the drain and the gate of the transistor have a silicide layer disposed thereon, and the suicide layer remains intact after disposed on the drain of the transistor; and
       a coupling capacitor coupled between the first power line and the gate of the transistor.

8. The ESD protection circuit as claimed in claim 7, wherein the ESD clamp circuit further comprises:
   a CMOS inverter coupled between the first power line and the second power line, wherein the CMOS inverter is arranged to control the gate of the transistor; and
   an RC retarder coupled between the first power line and the second power line, wherein when an ESD occurs, the RC retarder is arranged to control the CMOS inverter to turn the transistor on.

9. The ESD protection circuit as claimed in claim 7, wherein the transistor is a gate-coupled field-effect transistor.

10. The ESD protection circuit as claimed in claim 7, wherein the second power line is grounded.

11. The ESD protection circuit as claimed in claim 7, wherein the ESD clamp circuit is arranged to provide a grounding path from the first power line to the second power line through the transistor.

12. The ESD protection circuit as claimed in claim 7, wherein when the ESD occurs, a corresponding ESD voltage is induced to bias the gate of the transistor via the coupling capacitor.

* * * * *